United States Patent
Letts

(10) Patent No.: US 6,728,648 B1
(45) Date of Patent: Apr. 27, 2004

(54) TEST AND MEASUREMENT INSTRUMENT HAVING TELECOMMUNICATIONS MASK TESTING CAPABILITY WITH AN AUTOFIT TO MASK FEATURE

(75) Inventor: Peter J. Letts, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 74 days.

(21) Appl. No.: 09/602,575

(22) Filed: Jun. 22, 2000

Related U.S. Application Data

(60) Provisional application No. 60/155,977, filed on Sep. 24, 1999.

(51) Int. Cl.$^7$ .............................................. G06F 15/74
(52) U.S. Cl. ............................. 702/71; 702/57; 702/66; 702/67; 702/69; 702/73
(58) Field of Search .................... 702/57, 66–71, 702/73, 74, 80, 108, 117, 118, 120, 122, 124, 126, 183, 185, 186, 188, 189, FOR 103, FOR 104, FOR 110, FOR 134, FOR 135, FOR 170, FOR 171; 178/18.01, 18.02, 18.03, 18.04, 19.01, 19.02; 345/173, 177, 179, 446, 440.1

(56) References Cited

U.S. PATENT DOCUMENTS

| | | | |
|---|---|---|---|
| 4,497,062 A | * | 1/1985 | Mistretta et al. ............ 378/158 |
| 4,816,814 A | * | 3/1989 | Lumelsky ................... 345/441 |
| 5,012,467 A | * | 4/1991 | Crane ........................ 370/445 |
| 5,146,592 A | * | 9/1992 | Pfeiffer et al. .............. 395/157 |
| 5,206,883 A | * | 4/1993 | Seki ........................... 375/293 |
| 5,283,596 A | * | 2/1994 | Long .......................... 345/134 |
| 5,285,459 A | * | 2/1994 | Okuyama et al. ........... 714/811 |
| 5,313,577 A | * | 5/1994 | Meinerth et al. ........... 395/166 |
| 5,315,696 A | * | 5/1994 | Case et al. .................. 395/133 |
| 5,315,698 A | * | 5/1994 | Case et al. .................. 395/100 |
| 5,337,403 A | * | 8/1994 | Klingman .................... 395/140 |
| 5,434,593 A | * | 7/1995 | Lecklider et al. ........... 345/134 |
| 5,440,676 A | * | 8/1995 | Alappat et al. .............. 345/443 |
| 5,488,698 A | * | 1/1996 | Oliver et al. ................ 395/110 |
| 5,530,454 A | * | 6/1996 | Etheridge et al. ........... 345/134 |
| 5,594,850 A | * | 1/1997 | Noyama et al. ............. 395/133 |
| 5,668,819 A | * | 9/1997 | Fukushima .................. 714/736 |
| 5,929,842 A | * | 7/1999 | Vertregt et al. ............. 345/147 |
| 5,986,637 A | * | 11/1999 | Etheridge et al. ........... 345/134 |
| 6,097,755 A | * | 8/2000 | Guenther, Jr. et al. ....... 375/228 |
| 6,219,029 B1 | * | 4/2001 | Flakne et al. ............... 345/147 |
| 6,222,521 B1 | * | 4/2001 | Ivers et al. .................. 345/134 |

FOREIGN PATENT DOCUMENTS

JP     09018462 A   *   1/1997   ............. H04L/7/00

* cited by examiner

*Primary Examiner*—Marc S. Hoff
*Assistant Examiner*—Carol S Tsai
(74) *Attorney, Agent, or Firm*—Thomas F. Lenihan; William K. Bucher; Francis I. Gray

(57) ABSTRACT

Initial mask and waveform positions on a display screen may be determined by an AUTOSET TO MASK function. Upon detection of violations that occur after the AUTOSET TO MASK function is complete, control for further alignment of the waveform under test and the mask is assumed by an AUTOFIT TO MASK function. Comparison of the mask pixels and waveform pixels to detect collision between a waveform pixel and a mask pixel (i.e., a mask violation) is performed substantially in real time, as the pixels are being composited into the raster memory by the rasterizer. In the event of a mask violation, a mask violation signal is generated. In a further embodiment of the invention, in response to the mask violation signal, the AUTOFIT TO MASK function uses display rasterization to automatically redraw the waveform at a new location, until the waveform fits within the mask. In yet another embodiment, in response to the mask violation signal, the AUTOFIT TO MASK function automatically redraws the telecom mask at a new location until the waveform fits within the mask.

15 Claims, 5 Drawing Sheets

410

TEST AND MEASUREMENT INSTRUMENT HAVING TELECOMMUNICATIONS MASK TESTING CAPABILITY WITH AN AUTOFIT TO MASK FEATURE

CLAIM FOR PRIORITY

The subject application hereby claims priority from U.S. Provisional Patent Application Ser. No. 60/155,977, entitled TELECOMMUNICATIONS MASK TESTING, filed Sep. 24, 1999 in the names of Peter J. Letts and Steven C. Herring.

CROSS REFERENCE TO RELATED APPLICATIONS

The subject application is related to U.S. patent application Ser. No. 09/607,573 filed on Jun. 29, 2000, entitled A TEST AND MEASUREMENT INSTRUMENT HAVING TELECOMMUNICATIONS MASK TESTING CAPABILITY WITH A MASK ZOOM FEATURE, (Letts) assigned to the same assignee as the subject application, and also claiming priority from the above-identified U.S. Provisional application, and to U.S. patent application Ser. No. 09/619,067 filed on Jul. 19, 2000, entitled A TEST AND MEASUREMENT INSTRUMENT HAVING MULTI-CHANNEL TELECOMMUNICATIONS MASK TESTING CAPABILITY, (Letts and Herring), assigned to the same assignee as the subject application, and also claiming priority from the above-identified U.S. Provisional application.

FIELD OF THE INVENTION

The subject invention generally concerns test and measurement instruments, and in particular concerns those test and measurement instruments employing telecom mask features.

BACKGROUND OF THE INVENTION

In the telecommunications industry, it is commonplace to perform a test to determine if a particular signal is in compliance with parameters established by national and international communications standards bodies such as ITU-T and ANSI. A primary way to perform such a compliance test is to compare the pulse shape of a waveform acquired by an oscilloscope to a waveform "mask". The mask defines a pathway having minimum and maximum amplitude values, predetermined bit rate, and defined minimum slope on signal edges (i.e., minimum bandwidth). If the signal under test stays within the pathway boundaries, then the signal passes the test. This kind of test is known as Telecom Mask Testing.

A recent innovation in oscilloscope features has been a "AUTOSET TO MASK" function. The AUTOSET TO MASK function automatically sets up the horizontal, vertical, and triggering settings on the oscilloscope to accommodate the expected signal, and overlays a mask on the oscilloscope display. The procedure followed in the operation of an AUTOSET TO MASK function is to set the horizontal and vertical scales to a nominal value, acquire a waveform, and adjust the scale and position of the waveform by adjusting the settings of the input A/D converters, and display the mask. Unfortunately, it has been observed that the AUTOSET TO MASK function sometimes places the mask on the display with an undesired offset in the vertical or horizontal directions. The likelihood of incorrect placement of the mask depends upon several factors including the shape of the signal being acquired and the particular algorithm used to implement the AUTOSET TO MASK function.

It should be understood that an AUTOSET TO MASK function merely sets up the acquired waveform and displays the mask. It does not check for intrusions into the mask area by the waveform being tested (i.e., violations, or mask hits). Thus, the AUTOSET TO MASK function does not provide correction for such violations.

In this regard, note that telecommunications standards often allow some tolerance in vertical offset for the communications signal. That is, telecommunications standards are usually more concerned (i.e. exhibit tighter tolerances) with respect to other signal characteristics, such as pulse width, and rise time. If the telecom mask is incorrectly placed due to such an offset, an otherwise perfectly acceptable signal (i.e., one that should have passed) will unnecessarily fail when it is later tested for intrusions into the mask area.

One prior art response to this problem was a software solution used in the Tektronix 2400 DITS (Digital Interface Test System), manufactured by Tektronix, Inc., Beaverton, Oreg. In this arrangement, a waveform was acquired by the oscilloscope, rasterized, and stored. Each pixel of the rasterized waveform is indexed to a particular list of vertical segment points occupied by the mask at that particular horizontal (i.e., time) position. Thereafter, the individual pixels of the rasterized waveform were read out and compared, one by one, with the corresponding vertical array of mask segment locations to see if pixels in the mask area and the waveform coincided. If so, a "mask hit" was said to have occurred. This purely software solution counted the number of "mask hits" that occurred, and repositioned the mask (horizontally or vertically on the display) until the number of mask hits was reduced to zero. This assumes, of course, that the signal under test did, in fact, correspond to the applicable standard. It is important to note that this prior solution did not operate in real time but rather post-processed the rasterized waveform data.

While this solution does perform extremely well for ensuring compliance with standards for low speed telecommunication signals, it tends to be software intensive and time consuming. What is needed is a faster, less software intensive solution to the problem of properly registering the telecom mask with respect to the signal under test.

SUMMARY OF THE INVENTION

Initial mask and waveform positions on a display screen may be determined by an AUTOSET TO MASK function. Upon detection of violations that occur after the AUTOSET TO MASK function is complete, control for further alignment of the waveform under test and the mask is assumed by an AUTOFIT TO MASK function. Comparison of the mask pixels and waveform pixels to detect collision between a waveform pixel and a mask pixel (i.e., a mask violation) is performed substantially in real time, as the pixels are being composited into the raster memory by the rasterizer. In the event of a mask violation, a mask violation signal is generated.

In a further embodiment of the invention, in response to the mask violation signal, the AUTOFIT TO MASK function uses display rasterization to automatically redraw the waveform at a new location, until the waveform fits within the mask.

In yet another embodiment, in response to the mask violation signal, the AUTOFIT TO MASK function automatically redraws the telecom mask at a new location until the waveform fits within the mask.

DETAILED DESCRIPTION OF THE DRAWING

Figure 1:
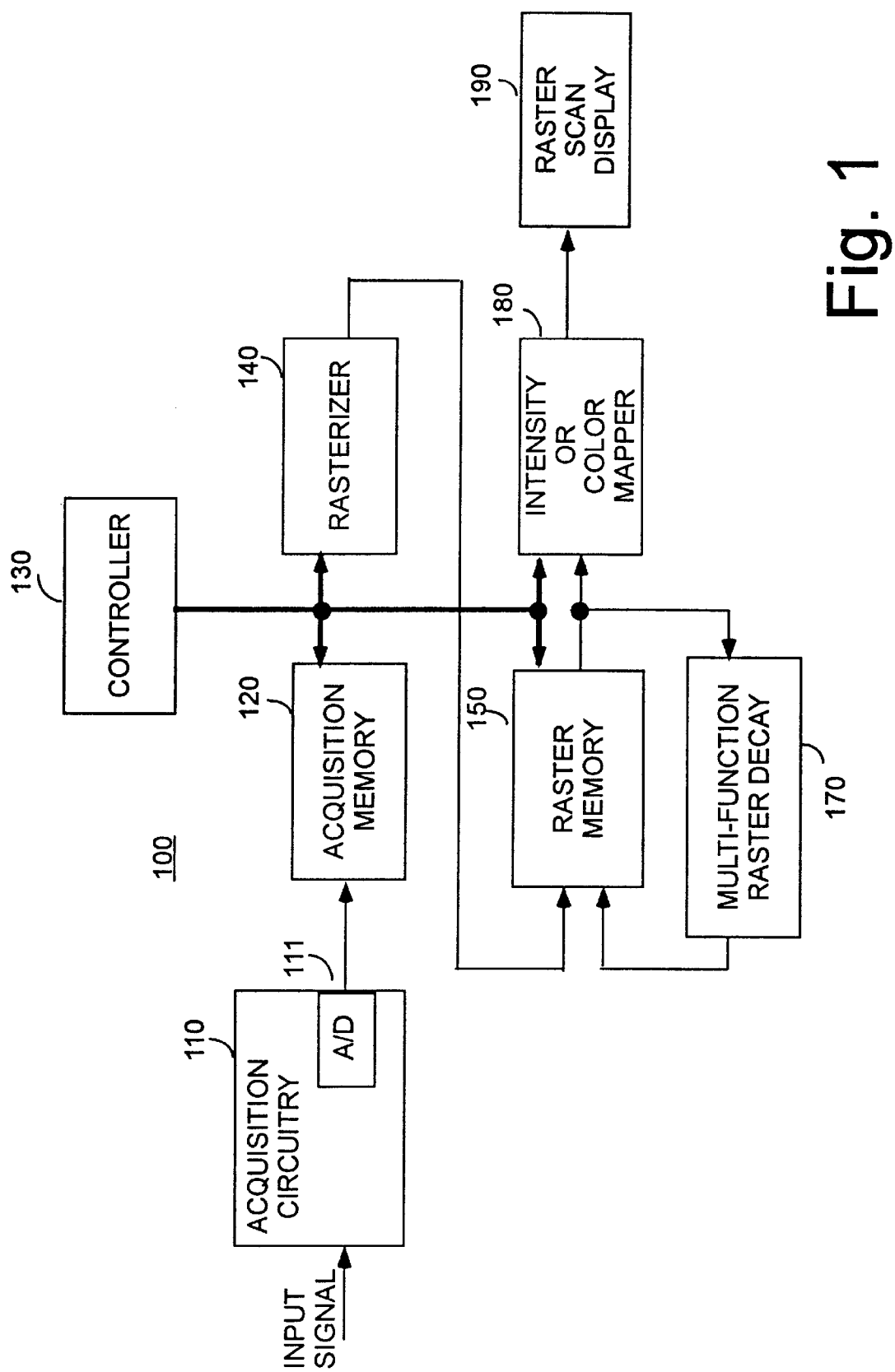
FIG. 1 is a simplified schematic of an oscilloscope suitable for use with the invention.

FIG. 1 shows, in simplified block diagram form, a digital oscilloscope 100 useful for practicing the invention. An input signal is applied to ACQUISITION CIRCUITRY 110 including an A/D (analog to digital) converter 111. ACQUISITION CIRCUITRY 110 substantially continuously samples the applied input signal at high speed and stores the samples in an ACQUISITION MEMORY 120.

In operation, digital oscilloscope 100 acquires information about the behavior of the input signal (i.e., a waveform) by periodically sampling the voltage present at the point where a probe (not shown for simplicity) is in contact with some node of a circuit under observation. The oscilloscope probe and front end of oscilloscope 100 are designed to precisely replicate the signal, or some predetermined fraction or multiple of the signal, and present it to A/D converter 111. The output of A/D converter 111 is a series of multi-bit digital words that are stored in ACQUISITION MEMORY 120. Successively acquired samples are stored at sequentially related addresses in the acquisition memory, and are thereby related to a time scale. Data at those addresses will eventually be converted back to a time scale by a RASTERIZER 140, and stored in a RASTER MEMORY 150. Display hardware such as INTENSITY OR COLOR MAPPER 180 reads the contents of RASTER MEMORY 150 and applies the data to a RASTER SCAN DISPLAY 190. The time scale, referred-to above, is represented as horizontal distance along the x-axis of the oscilloscope's RASTER SCAN DISPLAY 190.

For purposes of background information, a raster consists of horizontal rows and vertical columns. Each row can be identified by a location number along the vertical axis (y-axis), while each column can be identified by a location number along the horizontal axis (x-axis). Typically, in a digital oscilloscope, voltage amplitude values derived from the data contents of an acquisition memory location determine the vertical location (row number) of an illuminated pixel, while time values derived from the addresses of the acquisition memory determine the horizontal location (column number). The process of expanding the contents and addresses of an acquisition memory to produce contents for a two dimensional raster memory is known as "rasterization".

RASTERIZER 140 forms a composite multi-bit grayscale waveform by reading the contents of ACQUISITION MEMORY 120, reading the contents of the relevant location of RASTER MEMORY 150, combining the two and storing (i.e., compositing) the resulting value back into RASTER MEMORY 150. At substantially the same time, a MULTIFUNCTION RASTER DECAY unit 170 reads the contents of RASTER MEMORY 150 and decrements the data at a predetermined rate, and stores the decayed value back into RASTER MEMORY 150 for later display. All of the above-described functions may operate under control of a controller 130, which may be, for example, a PowerPC G3 microprocessor, a dedicated ASIC, or alternatively, controller 130 may be implemented as multiple processors.

Figure 2:
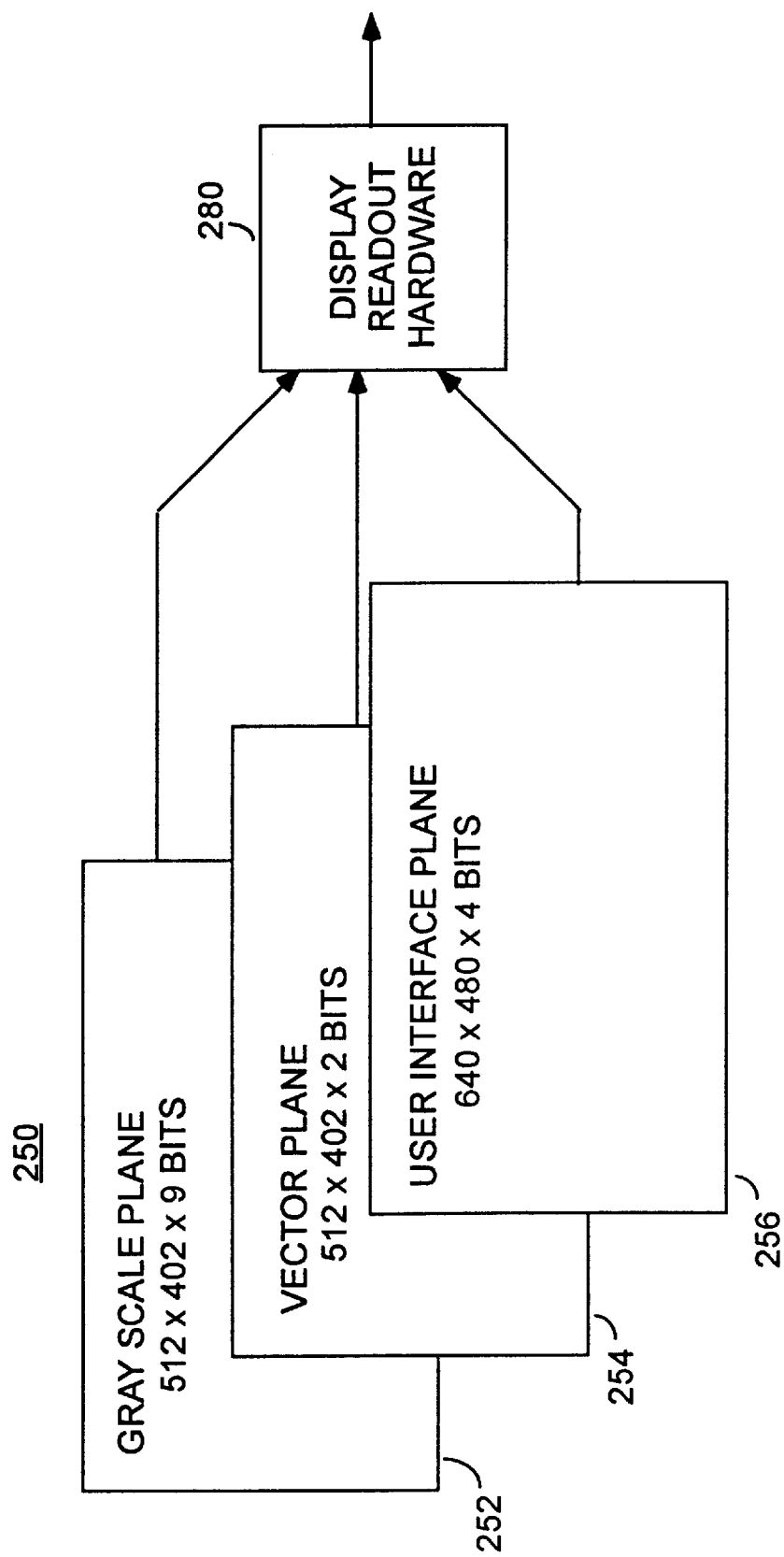
FIG. 2 is a simplified representation of the planes of memory employed by the apparatus of FIG. 1.

RASTER MEMORY 150 is shown in greater detail as RASTER MEMORY 250 in FIG. 2. RASTER MEMORY 250 comprises three planes of memory, a GRAY SCALE (GS) PLANE 252, a VECTOR PLANE 254, and a UI (User Interface) PLANE 256. One skilled in the art will realize that while it is easy to think of this structure in terms of memory "planes", they are really just contiguous blocks of fast SRAM display memory.

Waveform data is written into GS PLANE 252, which is an array of 205,824 memory locations arranged in a 512 by 402 matrix, with each memory location being nine bits long. The nine bits define intensity, color, and whether the pixel is a mask pixel or a waveform pixel.

VECTOR PLANE 254 is used for displaying waveforms resulting from mathematical operations (for example, the sum of the signals from channel 1 and channel 2), or for displaying a previously stored reference waveform. VECTOR PLANE 254 is an array of 205,824 memory locations arranged in a 512 by 402 matrix, with each memory location being two bits long. It is noted in passing that two bits will define three levels of illumination and the "OFF" state for a given pixel.

UI PLANE 256 is used to store pixel data associated with text characters, and it encompasses the entire 640 by 480 screen area. Thus, UI PLANE 256 is an array of 307,200 memory locations arranged in a 640 by 480 matrix, with each memory location being four bits long. The four bits define color and illumination level for a given pixel.

The output signals from the three planes 252, 254, and 256 are read out and combined for display in DISPLAY READOUT HARDWARE unit 280, typically at a 60 Hz rate.

Figure 3:
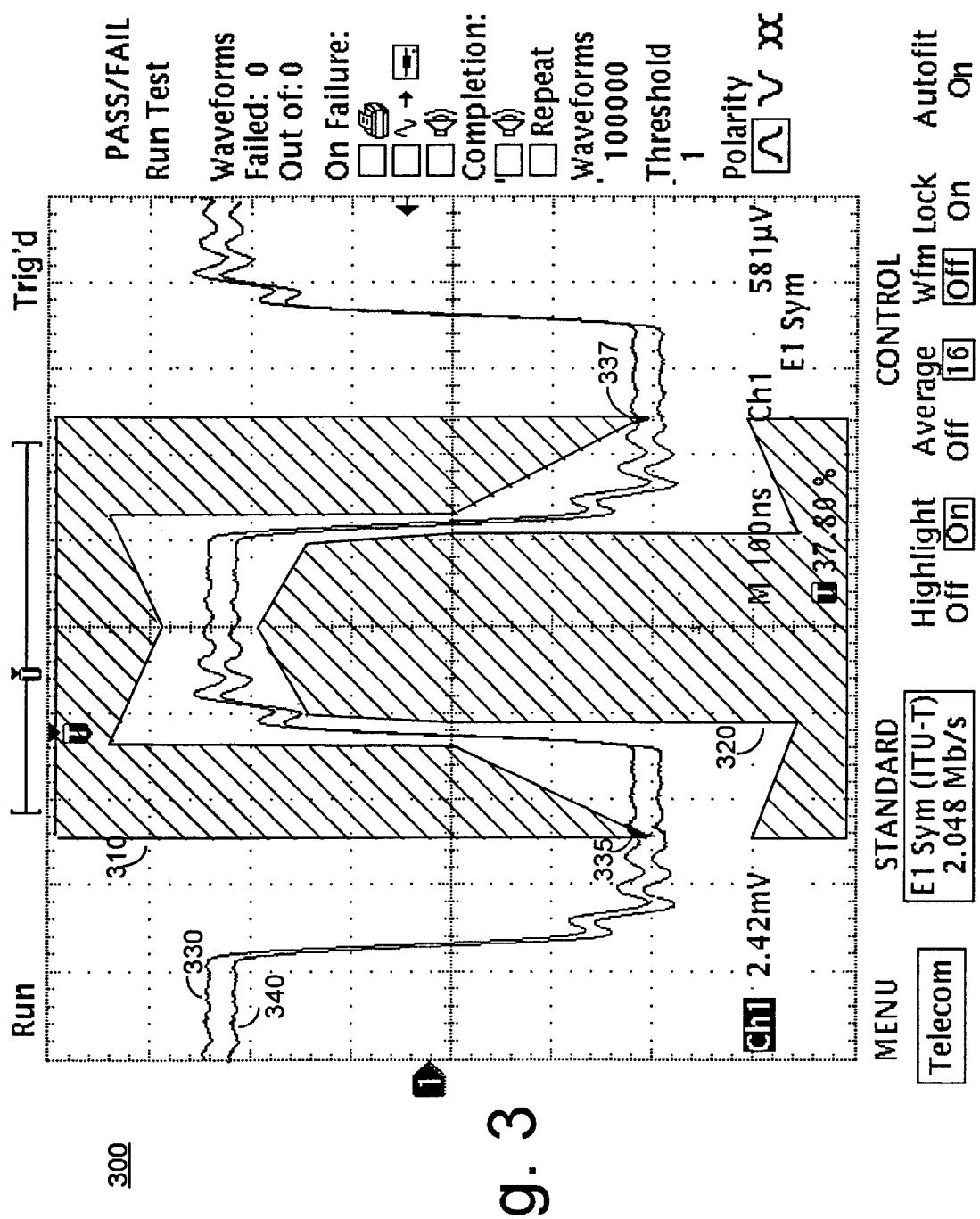
FIG. 3 shows a screen display of a telecom mask and waveform in accordance with one embodiment of the subject invention.

FIG. 3 shows two parts of a typical telecom mask 310, 320 displayed on a display screen of an oscilloscope. Controller 130 of FIG. 1 draws the telecom mask into display memory. It is drawn as a series of polygons (e.g. trapezoids) defined by a series of stored X-Y points. The telecom mask may be drawn into either of two memory planes depending upon its ultimate purpose. If the purpose is simply to view the telecom mask, or to move it about the screen, then it is drawn into VECTOR PLANE 254. However, if the purpose is to perform a comparison with waveform data as in the subject AUTOFIT TO MASK function, then the telecom mask is drawn into the GS PLANE 252. This is required because the rasterizer must have access to both the waveform data and the telecom mask data in order to detect violations (i.e., make a collision determination) between the two, as the pixels are being drawn into GS PLANE 252 of RASTER MEMORY 250.

Referring to FIG. 3, a display screen 300 of a digital oscilloscope, or the like, has displayed thereon, a telecom mask having an upper portion 310 and a lower portion 320. Each of upper portion 310 and lower portion 320 comprises individual segments composed of polygons (e.g., trapezoids).

Assume that an AUTOSET TO MASK feature has placed telecom mask 310, 320 on the display screen (written it into RASTER MEMORY 150) and has acquired and adjusted waveform 330 to nominal values. The AUTOFIT TO MASK function now takes control, and prevents decay of any pixel data in the mask area (so that the mask does not have to be continually redrawn).

Recall that existing data is read out of the relevant location of GS PLANE 252 of RASTER MEMORY 250 before new data is written into it. The existing data is combined with the new data for implementing the incrementing portion of the gray scaling feature (the decrementing portion of the gray scaling feature being accomplished by MULTI-FUNCTION RASTER DECAY unit 170). The combined data is then written back into the memory for display.

The subject invention recognizes that implementing the collision detection operation at the point when the existing data and the waveform data are being combined, enables operation of this feature at an extremely high rate of speed (approximately ten million points per sec). Thus, if the existing pixel data indicates that this pixel is part of the telecom mask, a collision between the waveform pixel and the mask pixel (i.e., a violation) is detected. In this regard, waveform 330 is illustrated as violating the telecom mask at points 335 and 337 due to an offset error. Upon detecting the first violation (i.e., at point 335), the AUTOFIT TO MASK feature initiates a compensating offset of the displayed position of the acquired waveform until it no longer violates the mask. Such a position of the waveform is illustrated by waveform 340. That is, for purposes of explanation, two waveforms 330, 340 are both shown displayed on display screen 300. In fact, waveform 340 is merely a repositioned version of waveform 330, and both would not be displayed simultaneously.

At first, one might think that the repositioning of waveform 330 could be accomplished by adjusting the gain and offset of input A/D Converter 111. While fine adjustments can be made in that fashion, larger adjustments require one to allow for settling time before measurements are valid. Even worse, if the adjustment caused operation of A/D Converter 111 to traverse one of several predetermined threshold levels, then changes in circuit configuration may involve the switching of relay contacts. Allowing for relay switching time and settling time would have a significant adverse impact on the speed with which mask testing could be performed.

It is herein recognized that it is not necessary to reconfigure the acquisition system in order to reposition waveform 330 with respect to the mask. Rather, the repositioning of waveform 330 with respect to the mask is accomplished by redrawing the waveform in a new position in GS PLANE 252 of RASTER MEMORY 250. It is important to note that this operation merely affects the displayed position of the waveform. As such, repositioning of the waveform with respect to the mask can be accomplished at high speed without the need to allow for any settling time at all.

Figure 4:
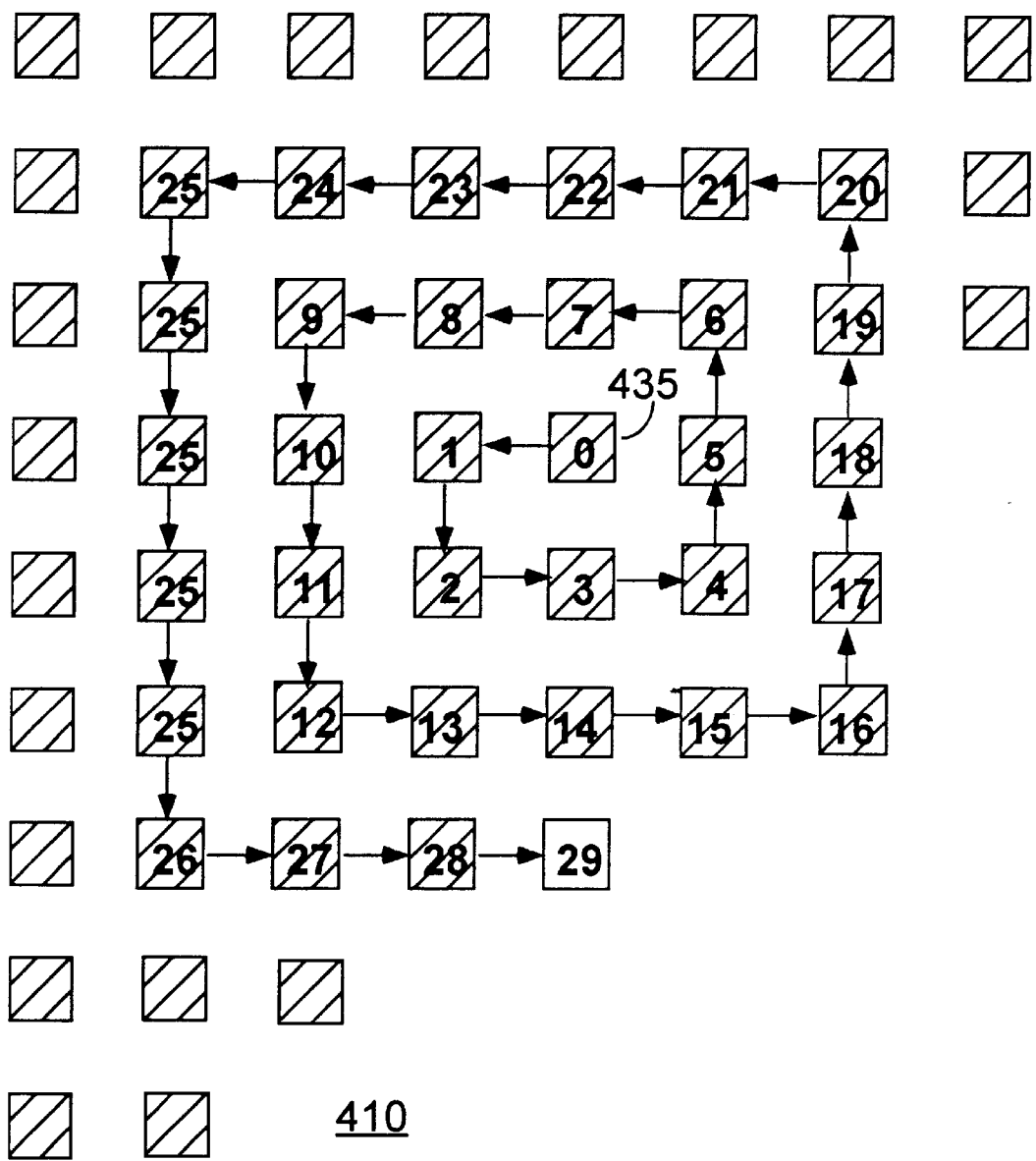
FIG. 4 is an illustration showing a magnified view of a portion of the telecom mask of FIG. 3.

A "spiral search" is one method for repositioning the waveform with respect to the mask. A usable form of spiral search is shown in FIG. 4. The squares of FIG. 4 represent pixels of display screen 300 (or perhaps memory locations in GS PLANE 252 of RASTER MEMORY 250). In particular, diagonally hatched pixels 410 represent the magnified tip of mask 310. A position 435 represents a point near the mask violation area 335 of FIG. 3. Assuming for purposes of explanation, that a collision was detected at pixel 0, a signal indicative of a mask violation would be generated (e.g., a "flag" bit set in memory), and a spiral search would progress outwardly, in a counterclockwise direction, examining pixels 1 through 28. Each of pixels 1 to 28 would indicate yet another violation. Assuming that pixel 29 is not part of the mask (as indicated by the fact that it is not diagonally hatched), the spiral search would terminate at that location. Note that pixel 29 is directly beneath pixel 0. This stopping point generally agrees with the placement of waveform 340 of FIG. 3. That is, stopping the spiral search at pixel 29 will cause rasterizer 140 to store all of the pixels of waveform 330 in memory locations that will be displayed lower on screen 330. This causes waveform 340 to appear on screen 300 directly below the location formerly occupied by waveform 330. In FIG. 4, the diagonal hatching of a pixel is used to represent a data value stored in a location of GS PLANE 252, wherein the data value indicates whether or not a particular pixel is part of the mask. It should also be noted that a given search radius sets an offset tolerance. That is, limiting the search radius prevents the waveform from being moved too far vertically, if such movement would extend beyond an offset limit defined by a particular signal standard.

One skilled in the art will realize that the movement of the mask and waveform are relative to one another. Thus, in the alternative, one could move the mask and keep the waveform stationary. A screen display for such an arrangement is shown in FIG. 5.

Figure 5:
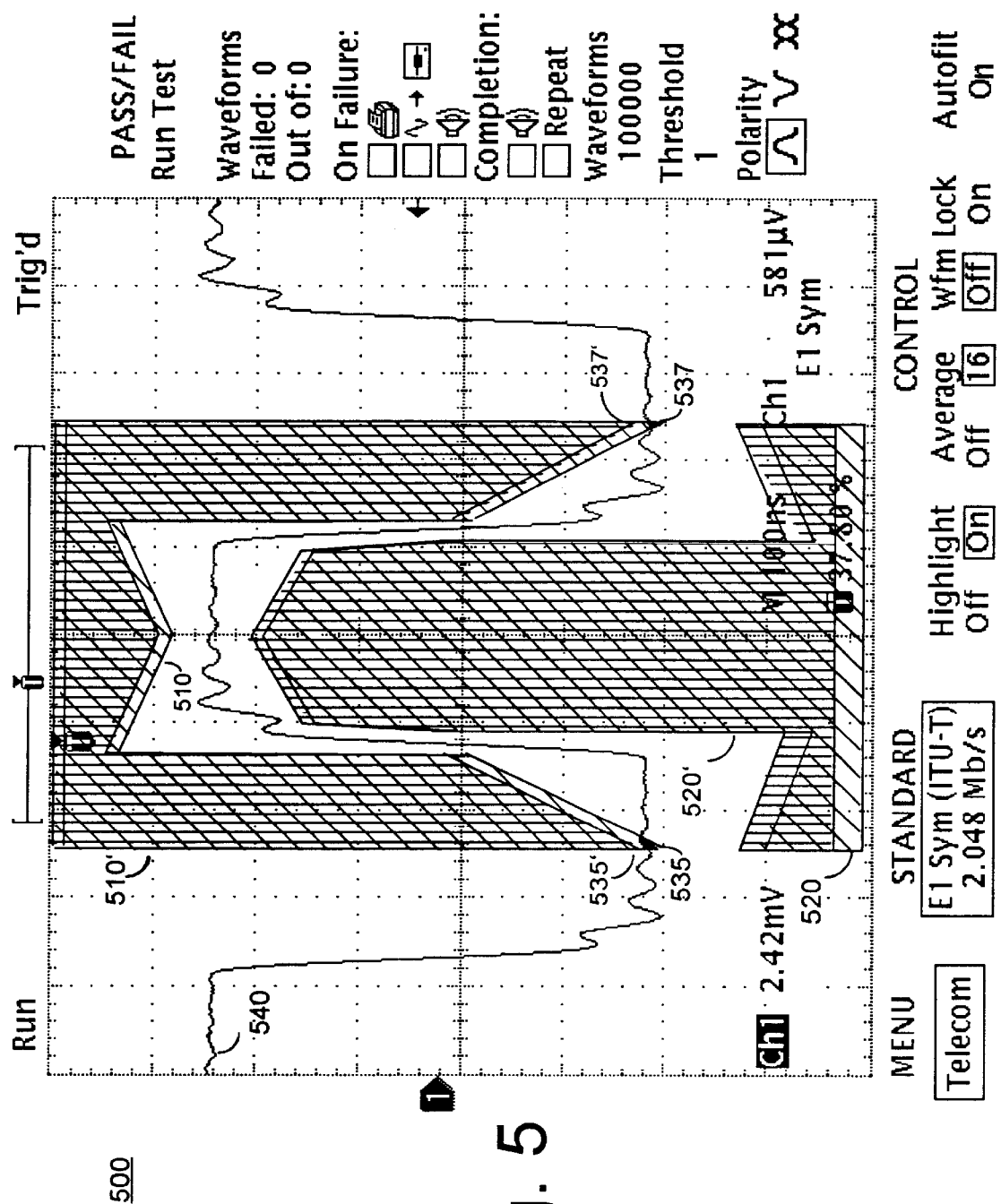
FIG. 5 shows a screen display of a telecom mask and waveform in accordance with a second embodiment of the subject invention.

In FIG. 5, a violation has occurred in the area of 535 and 537 of mask 510. In response, a spiral search is begun to locate a pixel in the area of 535 in which mask 510 and waveform 540 do not coincide. In this case the mask is moved upward until the violations cease. That new mask position is indicated by an overlaid mask 510'. Note that the violation no longer occurs at point 535', or at point 537'.

Because mask 510 is drawn by controller 130, moving the mask relative to the waveform will be always be very much slower than moving the waveform relative to the mask. If a user is concerned with over all testing time, then a slower arrangement in which the mask has to be redrawn may not be acceptable. With regard to speed of operation, because moving the mask with respect to the waveform occurs in the display rather than in the acquisition system, this alternative is still faster than the above-described prior art methods that necessarily incur delays due to settling time and relay operation.

However, the speed of this alternative could be improved by changing controller 130 from a microprocessor to a dedicated ASIC. In this way, the speed with which the mask can be drawn to memory would be greatly increased. Such an arrangement is deemed to lie with the scope of the present invention.

What has been described is a very high-speed method and apparatus for repositioning a waveform with respect to a telecom mask, or a high-speed method and apparatus for repositioning a telecom mask with respect to a waveform.

It is also recognized that it is the comparison of mask pixel data and waveform pixel data substantially in real time by the RASTERIZER as the pixels are being stored into RASTER MEMORY that is the basic advance in the art provided by the subject invention. This is true whether or not correction to eliminate violations is made. Thus, in a further embodiment, upon detection of a violation by the subject apparatus, a signal indicative of the violation is generated.

While a particular spiral search method was discussed, one skilled in the art will recognize that other search methods may also be used. Although the subject invention was described with respect to a digital oscilloscope, it is herein recognized that the invention may be applicable to other test and measurement equipment, such as a logic analyzer, or a communications network analyzer, or the like.

While the X-Y points for generating the mask were described as previously stored, one skilled in the art will appreciate that the user can download his own data from a PC through a data port of the test and measurement instrument in order to create custom masks.

What is claimed is:

1. A test and measurement instrument having mask testing capability, comprising:
an acquisition system for acquiring samples of a waveform;
a controller for generating mask pixel data defining a mask;
an acquisition memory for storing said waveform samples;
a raster memory for storing said mask pixel data, said mask pixel data including an identification code; and
comparison circuitry for reading a first memory location of said raster memory to which a particular waveform sample of said acquired waveform is to be written, and determining substantially in real time if said first memory location is currently storing a mask pixel, said first memory location being one of a first group of memory locations;
said comparison circuitry generating a violation signal indicative of a mask violation in response to said determination;
wherein,
said comparison circuitry is a rasterizer; and
said comparison is performed by said rasterizer examining pixel data of said raster memory for said identification code as said waveform samples are composited into said raster memory.

2. The test and measurement instrument of claim 1, further including:
display circuitry coupled to said raster memory for displaying said mask and said waveform;
said rasterizer compositing said waveform samples in a second group of memory locations in response to said violation signal, said second group of memory locations causing a change in displayed position of said waveform with respect to a displayed position of said mask.

3. The test and measurement instrument of claim 2, wherein said controller causes rasterizer to composite said waveform samples into said second group of memory locations in response to a search pattern for locating a waveform display position with respect to said displayed position of said mask that does not cause mask violations.

4. The test and measurement instrument of claim 2 wherein said controller generating mask pixels is a microprocessor.

5. The test and measurement instrument of claim 2 wherein said controller generating mask pixels is a dedicated ASIC.

6. The test and measurement instrument of claim 1, further including:
display circuitry coupled to said raster memory for displaying said mask and said waveform;
said circuitry for generating mask pixels composites said mask pixels in a second group of memory locations in response to said violation signal, said second group of memory locations causing a change in displayed position of said mask with respect to a displayed position of said waveform.

7. The test and measurement instrument of claim 6, wherein said controller causes said mask pixels to be composited into said second group of memory locations in response to a search pattern for locating a mask display position with respect to displayed position of said waveform that does not cause mask violations.

8. The test and measurement instrument of claim 7 wherein said circuitry for generating mask pixels is a microprocessor.

9. The test and measurement instrument of claim 7 wherein said circuitry for generating mask pixels is a dedicated ASIC.

10. The test and measurement instrument of claim 1 further comprising:
a data port for receiving data relating to said mask;
said controller being coupled to said data port and generating a mask from said data relating to said mask.

11. The test and measurement instrument of claim 1 wherein:
said test and measurement instrument is a digital oscilloscope.

12. A method for correcting for mask violations in test and measurement instrument having mask testing capability, comprising the steps of:
acquiring samples of a waveform;
generating mask pixel data defining a mask;
storing said waveform samples in an acquisition memory;
storing said mask pixel data in a raster memory, said mask pixel data including an identification code;
comparing mask pixel data and waveform sample data by reading a first memory location of said raster memory to which said waveform sample is to be written, and determining substantially in real time if said first memory location is currently storing a mask pixel, said first memory location being one of a first group of memory locations;
generating a violation signal indicative of a mask violation in response to said determination;
displaying said mask and said waveform on a display screen; and
compositing said waveform samples in a second group of memory locations in response to said violation signal to cause a change in displayed position of said waveform with respect to a displayed position of said mask;
wherein,
said comparing step is performed by a rasterizer examining pixel data of said raster memory for said identification code as said waveform samples are composited into said raster memory.

13. The method of claim 12, wherein said compositing step includes:
compositing of said waveform samples into said second group of memory locations by said rasterizer in response to a search pattern for locating a desired waveform display position with respect to said displayed position of said mask, wherein said desired waveform position does not cause mask violations.

14. The method of claim 12, further including the steps of:
displaying said mask and said waveform on a display; and
compositing said mask pixels in a second group of memory locations in response to said violation signal, said second group of memory locations causing a change in displayed position of said mask with respect to a displayed position of said waveform.

15. The method of claim 14, wherein said compositing step includes:
compositing said mask pixels into said second group of memory locations in response to a search pattern for locating a desired mask display position with respect to displayed position of said waveform, wherein said desired mask display position does not cause mask violations.

* * * * *